United States Patent
Hagh-Panah et al.

(10) Patent No.: US 7,047,479 B1
(45) Date of Patent: May 16, 2006

(54) PARALLEL CRC FORMULATION

(75) Inventors: Morteza Hagh-Panah, San Jose, CA (US); Hassan Kamgar, San Jose, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 498 days.

(21) Appl. No.: 10/068,676

(22) Filed: Feb. 4, 2002

(51) Int. Cl.
*H03M 13/00* (2006.01)

(52) U.S. Cl. ........................... 714/774; 714/758
(58) Field of Classification Search ................ 714/757, 714/756, 758, 774, 781–784
See application file for complete search history.

(56) References Cited

U.S. PATENT DOCUMENTS

| | | | |
|---|---|---|---|
| 4,949,342 A | | 8/1990 | Shimbo et al. |
| 5,050,165 A | * | 9/1991 | Yoshioka et al. ........... 370/401 |
| 5,282,215 A | * | 1/1994 | Hyodo et al. ............... 714/775 |
| 6,530,057 B1 | * | 3/2003 | Kimmitt ..................... 714/758 |
| 6,675,236 B1 | * | 1/2004 | Moon et al. ................. 710/29 |

OTHER PUBLICATIONS

Scott, "Understanding Cyclic Redundancy Check," Mar. 1999, pp. 1-14.

"Modular Arithmetic," © 1996-2001 Alexander Bogomolny, pp. 1-4.

Barr, "Easier Said Than Done," © 2000 Miller Freeman, pp. 1-11.

Barr, "Checking Up," © 1999 Miller Freeman, pp. 1-8.

Barr, "Strength in Numbers," © 1999 Miller Freeman, pp. 1-6.

Perez, "Byte-wise CRC Calculations," IEEE Micro, Jun. 1983, pp. 40-50.

* cited by examiner

*Primary Examiner*—Joseph Torres
(74) *Attorney, Agent, or Firm*—Kevin L. Daffer; Daffer McDaniel, LLP (57) ABSTRACT

A system and method that calculates multiple bytes of data in a single cycle. The invention uses at least two CRC circuits to calculate a CRC value for a string of data. A first CRC circuit is used for calculating multiple bytes at a time. A second CRC circuit is used for calculating a single byte. The first CRC circuit is only used when there are multiple bytes to be processed. If there are other CRC circuits, then data is directed to the appropriate CRC circuit, i.e., the CRC circuit that calculates the appropriate number of bytes, when the number of bytes remaining to be processed is less than the first CRC circuit can process. Otherwise, the data is directed to the second CRC circuit, and must be processed one byte at a time until there is no more data remaining.

15 Claims, 8 Drawing Sheets

PARALLEL CRC FORMULATION

BACKGROUND OF THE INVENTION

1) Field of the Invention

The invention relates generally to communication over networks, and more particularly to error detection using cyclic redundancy checks.

2) Description of Background Art

Electronic information is often shared through computer networks. These networks can vary in size from small networks of just a few devices sharing information to large-scale global networks, such as the Internet. Regardless of the size, there must be a mechanism in every network to transport information. Information in the form of electrical signals are often transported through copper cable; information in the form of optical signals are transported through fiber optic cables; and other electromagnetic waves can be transported through the air.

Figure 1:
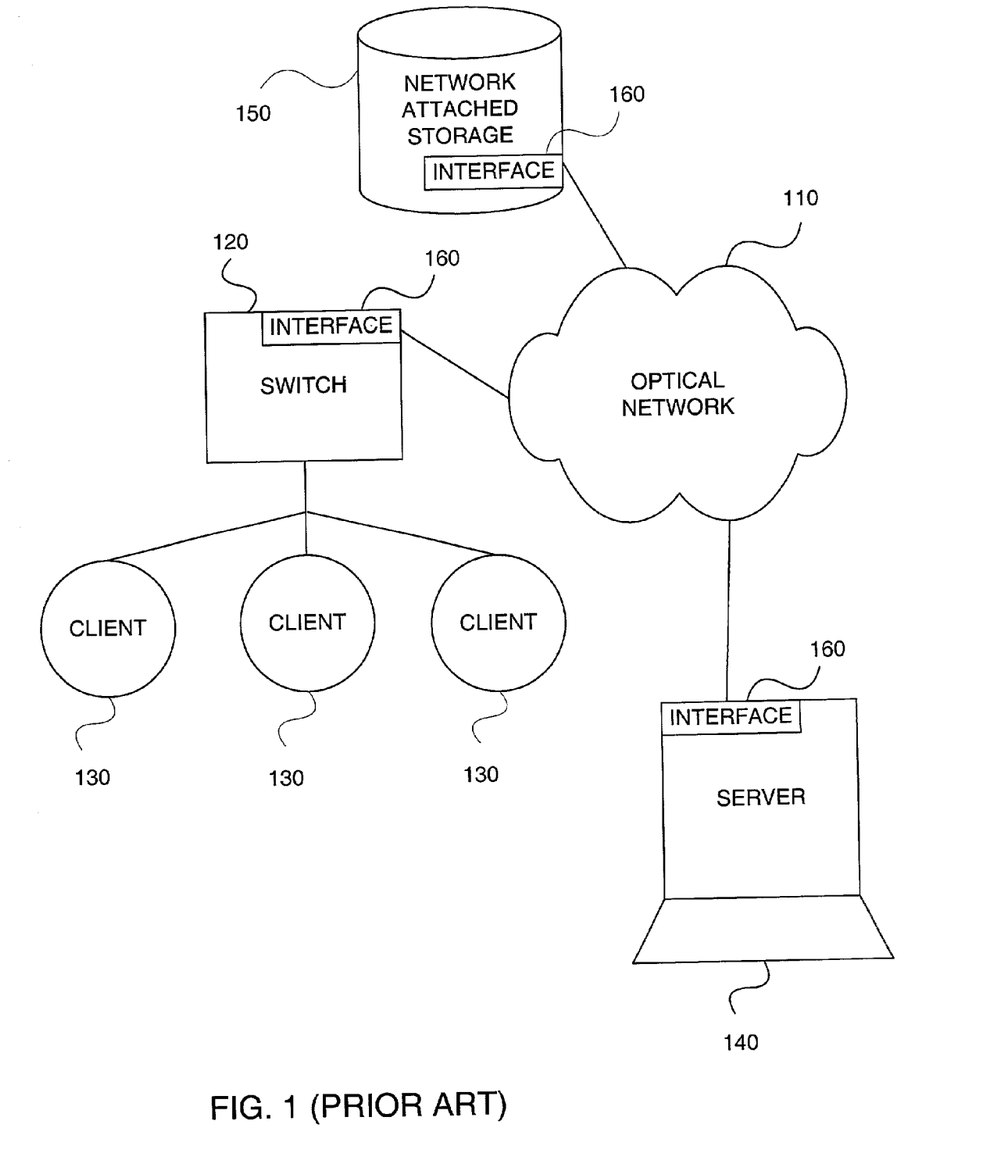
FIG. 1 is a prior art diagram of various devices on an optical network.

FIG. 1 shows several devices connected together through an optical network 110. Optical networks have several advantages, including a large bandwidth, low susceptibility to interference, light-weight cables, and an ability to transmit information digitally rather than in analog. Devices attached to an optical network can include a switch 120, a server 140, and a network attached storage (NAS) 150 or any like device capable of transmitting and receiving data packets.

Switch 120 is an example of a device that filters and forwards packets of information between local area network (LAN) clients 130. Clients 130 can include a desktop computer, laptop, personal digital assistant (PDA), printer or other network attached device.

Server 140 controls network resources. For example a file server stores files, a print server manages one or more printers, a network server manages network traffic, and a database server processes database queries. Servers 140 can include UNIX servers, NT servers, Windows 2000 servers, LINUX servers, or other computer systems attached to the network. Network attached storage 150 is a special type of server 140 that is dedicated to file sharing and cannot perform other functions, such as authentication or file management.

Each device 120, 140, and 150 must have an interface circuit board 160 installed in order to communicate across optical network 110. Signals on optical network 110 travel at a rate faster than devices 120, 140, and 150 can understand. Also, optical signals are serialized (travel bit by bit) and devices 120, 140, and 150 use parallel data streams. Therefore, interface circuit board 160 translates serial optical signals into a slower, parallel data stream when receiving optical information, and conversely translates parallel data streams into faster, serial bit streams when transmitting information.

Interface circuit boards 160 known in the art use old Ethernet protocol standards. Specifically, old Ethernet protocols allowed throughputs of only 10 megabits per second over a network medium. However, a newer, faster, 10-Gigabit Ethernet standard has recently been defined. Interface circuit boards 160 designed to operate according to old Ethernet protocols cannot be readily adapted for use with the new standard because both translations from the transport medium to the devices on the network and collision detection mechanisms function differently.

In principal, both the old and new standards, however, rely on cyclic redundancy check (CRC) for determining when errors ore present in a data stream. A CRC performs a mathematical calculation on a data stream before and after data transmission. If the two results are identical, then it is assumed that no errors occurred during transmission.

Specifically, the mathematical calculation that is performed is division of the data stream by an agreed upon generator polynomial in modulo 2. Modular arithmetic, proposed by K. F. Gauss in 1801, assumes that two numbers are equal if, and only if, their difference is exactly divisible by N. In modulo 2 (or Mod-2) N is equal to 2. Although the details of modulo 2 division are beyond the scope of this document, it should be noted that one of the benefits of using modular arithmetic is that a relatively simple and well-known circuit can perform the necessary calculation.

Figure 2:
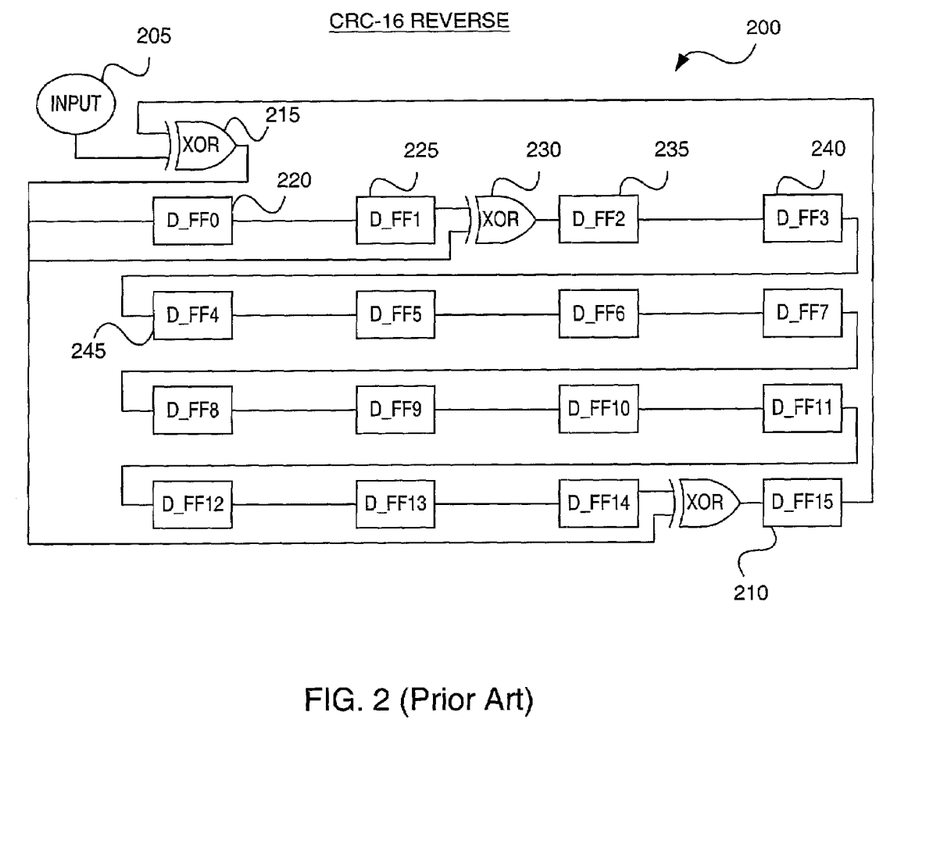
FIG. 2 is a prior art diagram of a circuit that performs a 16 bit CRC calculation.

FIG. 2 shows a circuit 200 that performs a bit-wise CRC calculation (i.e., a CRC calculation that is performed one bit at a time). The generator polynomial used in circuit 200 is $X^{16}+X^{14}+X^{1}+X^{0}$, which is represented as 10100000000000011 in base 2. In theory, any generator polynomial could be used, as long as both the transmitting and receiving end use the same polynomial. However, the above polynomial, called the CRC-16 Reverse polynomial, has been determined to be especially effective, and is used throughout the industry.

Input 205 to circuit 200 is the data stream, taken serially. In the first cycle the first bit of data, D0, is combined with the information in a delay flip flop fifteen 210, C15, using a first: XOR circuit 215, to produce a result. The result of first XOR circuit 215, D0 XOR C15, is then input directly in delay flip flop zero 220. Delay flip flop zero 220 inputs its original information, C0, to a delay flip flop one 225. Information that was contained in delay flip flop one 225, C1, is combined with the result from first XOR circuit 215, D0 XOR C15, with a second XOR circuit 230 and input in a delay flip flop two 235 to produce C1 XOR D0 XOR C15. Information that was in delay flip flop two 235, C2, is input to a delay flip flop three 240, which inputs its information, C3, into delay flip flop four 245. The process continues until each delay flip flop has updated information. The updated values after the first input cycle are shown in Table 1.

TABLE 1

| REGISTER | VALUE |
| --- | --- |
| D_FF0 | D0 XOR C15 |
| D_FF1 | C0 |
| D_FF2 | C1 XOR D0 XOR C15 |
| D_FF3 | C2 |
| D_FF4 | C3 |
| D_FF5 | C4 |
| D_FF6 | C5 |
| D_FF7 | C6 |
| D_FF8 | C7 |
| D_FF9 | C8 |
| D_FF10 | C9 |
| D_FF11 | C10 |
| D_FF12 | C11 |
| D_FF13 | C12 |
| D_FF14 | C13 |
| D_FF15 | C14 XOR D0 XOR C15 |

In the next cycle (i.e., next data bit), the process is repeated, except with the second bit of data, D1. At the end of the second cycle the information in each delay flip flop can be expressed as a function of the initial information in the delay flip flops, C0–C15, and the two bits of data, D0 and D1. For example, information in delay flip flop zero 220 can be expressed as D1 XOR C14 XOR D0 XOR C15, information in delay flip flop one 225 can be expressed as D0

XOR C15. Table 2 shows the values in each register at the end of the second input cycle.

TABLE 2

| REGISTER | VALUE |
| --- | --- |
| D_FF0 | D1 XOR C14 XOR D0 XOR C15 |
| D_FF1 | D0 XOR C15 |
| D_FF2 | C0 XOR D1 XOR C14 XOR D0 XOR C15 |
| D_FF3 | C1 XOR D0 XOR C15 |
| D_FF4 | C2 |
| D_FF5 | C3 |
| D_FF6 | C4 |
| D_FF7 | C5 |
| D_FF8 | C6 |
| D_FF9 | C7 |
| D_FF10 | C8 |
| D_FF11 | C9 |
| D_FF12 | C10 |
| D_FF13 | C11 |
| D_FF14 | C12 |
| D_FF15 | C13 XOR D1 XOR C14 XOR D0 XOR C15 |

The CRC calculation ends when there is no more data to input into the circuit. The final values in the delay flip flops are collectively called the residue, which is equal to the remainder of the data stream divided by the generator polynomial 10100000000000011 in mod-2 arithmetic. It should be noted that the values of C0, C1, C2 . . . C15 are zero in this circuit 200. As will be seen, C0, C1, C2 . . . C15 are only relevant for bit-wise calculations.

Figure 3:
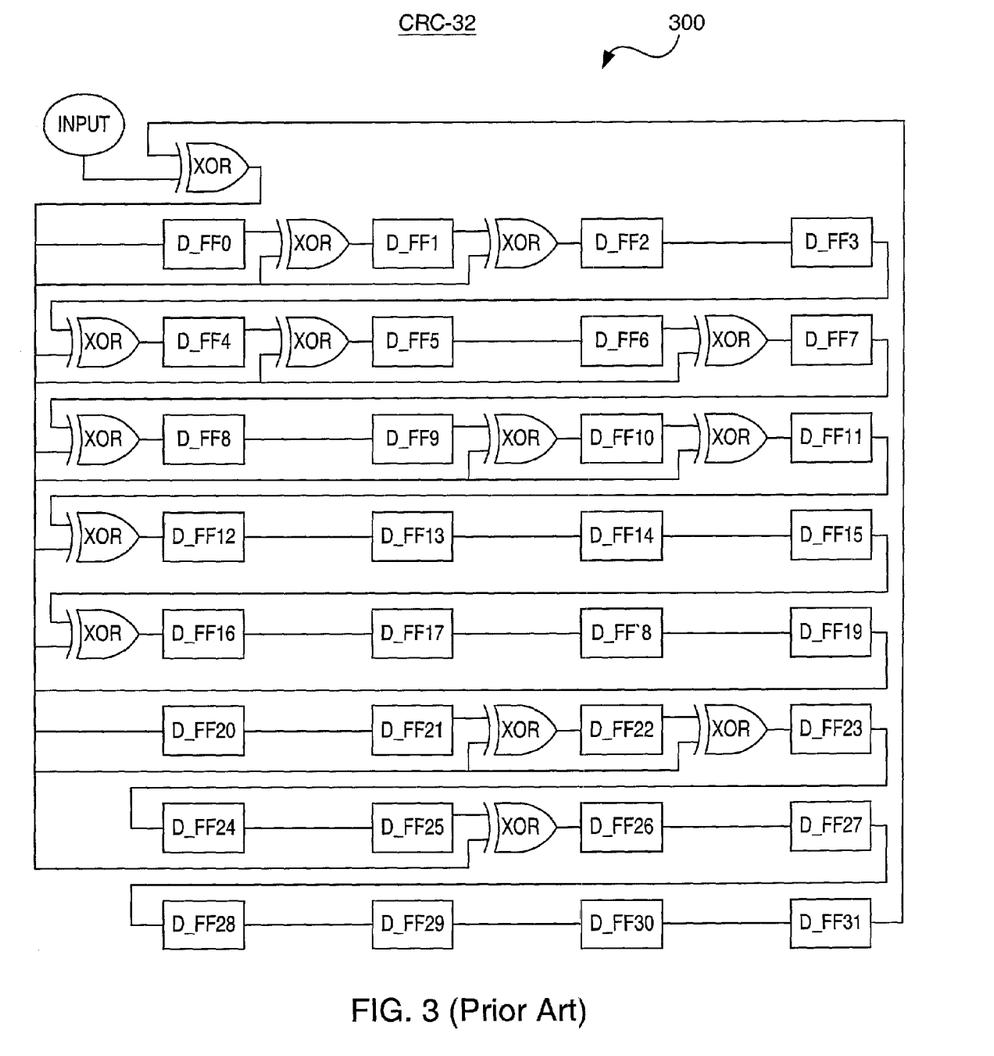
FIG. 3 is a prior art diagram of a circuit that performs a 32 bit CRC calculation.

FIG. 3 shows a circuit 300 that performs a CRC calculation using a larger generator polynomial. The generator polynomial used in circuit 300 is $X32+X26+X23+X22+X16+X12+X11+X10+X8+X7+X5+X4+X2+X1+X0$, which is represented as 100000100110000010001110110110111 in base 2, and is commonly called the CRC-32 polynomial. Circuit 300 works in a similar fashion as circuit 200.

However, both circuits 200 and 300 are very slow, taking a full cycle for every bit of data in the data stream. The process was significantly improved upon when circuits were created that calculated values a byte at a time instead of a bit at a time, as described in "Byte-wise CRC Calculations," *IEEE Micro*, June 1983, pp. 40–50 by Aram Perez.

Aram Perez describes a process by which a bit-wise CRC circuit, such as circuit 200 or circuit 300 is first modeled. Next, the general values of each flip flop after eight bits (one byte) is calculated. Finally, a circuit that implements the calculations is created using, for example, automatic circuit design techniques. Table 3 shows the values in each register at the end of the eighth cycle using the CRC-16 Reverse polynomial from circuit 200 shown in FIG. 2. Although the values of C0, C1, C2 . . . C15 are initially zero, in later cycles they represent the residue in each register from the previous cycle.

TABLE 3

| REGISTER | VALUE (XOR TAKEN OF MULTIPLE VALUES) |
| --- | --- |
| D_FF0 | D0, D1, D2, D3, D4, D5, D6, D7, C8, C9, C10, C11, C12, C13, C14, C15 |
| D_FF1 | D0, D1, D2, D3, D4, D5, D6, C9, C10, C11, C12, C13, C14, C15 |
| D_FF2 | D6, D7, C8, C9 |
| D_FF3 | D5, D6, C9, C10 |
| D_FF4 | D4, D5, C10, C11 |
| D_FF5 | D3, D4, C11, C12 |
| D_FF6 | D2, D3, C12, C13 |
| D_FF7 | D1, D2, C13, C14 |
| D_FF8 | D0, D1, C0, C14, C15 |

TABLE 3-continued

| REGISTER | VALUE (XOR TAKEN OF MULTIPLE VALUES) |
| --- | --- |
| D_FF9 | D0, C1, C15 |
| D_FF10 | C2 |
| D_FF11 | C3 |
| D_FF12 | C4 |
| D_FF13 | C5 |
| D_FF14 | C6 |
| D_FF15 | D0, D1, D2, D3, D4, D5, D6, D7, C7, C8, C9, C10, C11, C12, C13, C14, C15 |

To one skilled in the art, creating a circuit that performs the above operations is trivial. Such a circuit would perform calculations eight times faster than circuit 200 or 300.

Figure 4A:
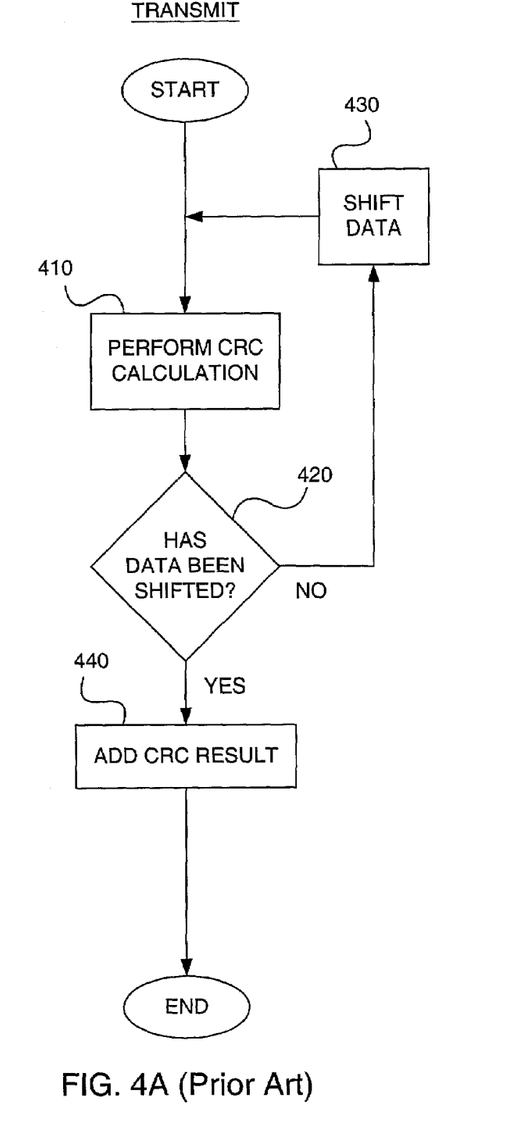
FIG. 4A is a prior art flow chart of a method of implementing CRC during the transmit process.
Figure 4B:
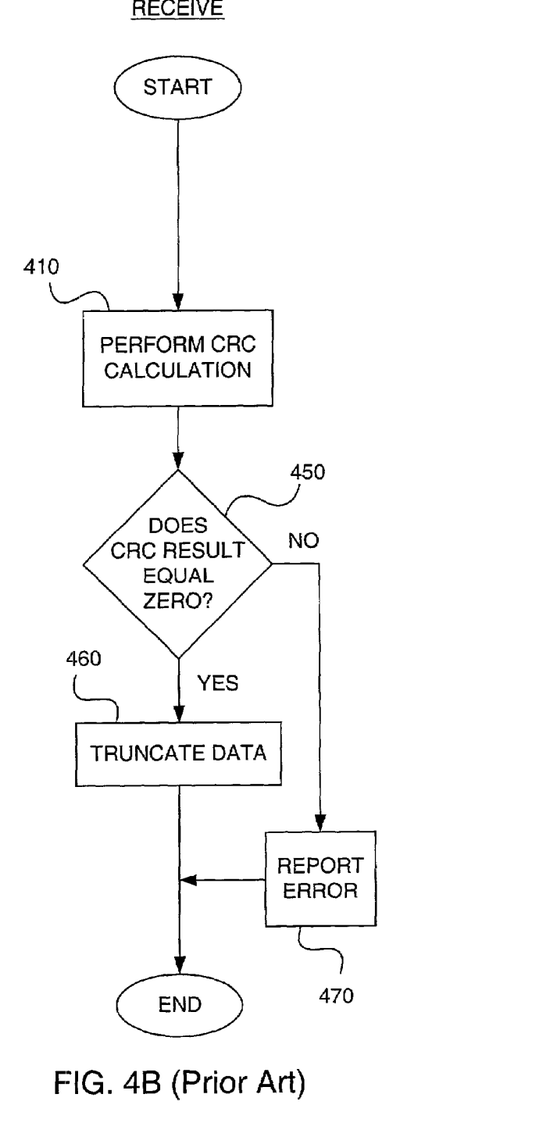
FIG. 4B is a prior art flow chart of a method of implementing CRC during the receive process.

However, performing the CRC calculation is only one piece of the total CRC process. The rest of the process depends upon whether interface circuit board 160 is transmitting or receiving data. FIG. 4A shows the basic method used during the transmit process and FIG. 4B shows the basic method used during the receive process.

Step 410, where the actual CRC calculation is performed by either a bit-wise or a byte-wise CRC circuit, is the first step in the transmit process. Next, in step 420, a determination is made as to whether the data has been shifted.

Like any remainder, the CRC result represents how far away numerically the dividend is from being evenly divisible by the divisor. In regular division, the remainder must be subtracted from the dividend in order to be evenly divisible. For example, 17 divided by 4 gives a remainder of 1, which must be subtracted from 17 in order to make 16 and be evenly divisible by 4. (There are, of course, other relationships between the dividend, remainder and divisor, which are not important for this discussion.) However, in modular division, the remainder can be added to the dividend in order to make the number evenly divisible by the divisor. CRC transmitting circuits use this relationship by adding the remainder to the dividend so that the CRC receiving circuit will calculate a zero remainder if no error is present.

In order to prevent the CRC receiving circuit from then having to subtract the remainder from the dividend to retrieve the original data stream, the data is shifted prior to adding the remainder. Since the remainder will always be less than the generator polynomial the data only needs to be shifted by the same order of magnitude as the generator polynomial. If the CRC-32 polynomial were being used, 32 zeros would be appended to the data. Appending 32 zeros is equivalent to multiplying the data by $2^{32}$. Therefore, the result from the CRC calculation is equal to the remainder from a mod 2 division, where the dividend is equal to the data multiplied by $2^{32}$ and the divisor is equal to the CRC-32 polynomial.

Referring back to FIG. 4, if data has not been shifted step 420 directs the process to step 430, where the data is shifted the same order of magnitude as the generator polynomial and then directed back to step 410 for more CRC calculations.

Once data has been shifted, the process proceeds to step 440 where the CRC result is added to the shifted data. As previously mentioned, since the maximum possible remainder will always be less than or equal to the generator polynomial, the CRC result will at most replace the added zeros and never modify the actual data.

FIG. 4B shows the basic method used during the receive process. The process begins with step 410, the same step that is used in the transmit process. The same bit-wise or byte-wise CRC circuit that was used in the transmit process can also be used in the receive process. In step 450 the new CRC result is examined. If the result does not equal zero, then the system reports an error in step 470. 1f the remainder is zero, it is assumed that no error is present, and the process proceeds to step 460. In step 460 the data is truncated the same amount as it was shifted in step 430 from the transmit process. Therefore, step 460 returns the data back to its original state.

Although the byte-wise CRC calculation worked very well with the old Ethernet standard, the new 10-Gigabit Ethernet standard requires CRC calculations to be completed in a much shorter time.

BRIEF DESCRIPTION OF THE INVENTION

The present invention provides a system and method of performing a CRC calculation on multiple bytes of data in a single cycle. The system includes a multiple-byte CRC circuit, which in one embodiment, may comprise a first CRC module, a second CRC module and a decision module.

The first CRC module performs the CRC operation on a maximum number of bytes of data in a cycle and produces a result. The maximum number of bytes will often be eight, but there may be applications where it is desirable to process more or less bytes of data in each cycle. The second CRC module performs the CRC operation on a single byte of data, and also produces a result. Both CRC modules are capable of using prior results when performing their CRC operation. Being able to use the result of a prior cycle ensures that a long string of data can be accurately processed in multiple cycles. The decision module directs data to the second CRC module only when the number of remaining bytes of data to be processed is greater than or equal to the maximum number of bytes.

In a specific embodiment of the invention, the multiple-byte CRC circuit uses a total of eight CRC modules. Each CRC module processes a different number of bytes, with eight being the maximum number of bytes in this specific embodiment, the decision module directs the data to one of the eight CRC modules, depending on the number of bytes of data to be processed.

The first step in the method of performing a CRC calculation on data is providing a plurality of CRC modules, at least one CRC module being able to perform the CRC calculation on a maximum number of bytes of data and at least one CRC module able to perform the CRC calculation on only a single byte of data. The next step is determining which one of the plurality of CRC modules is appropriate for processing a number of bytes. The next step is processing the number of bytes with the appropriate CRC module. Finally, the steps of determining which CRC module is appropriate and processing the number of bytes with the appropriate CRC module are repeated until there are no more bytes to process.

DETAILED DESCRIPTION OF THE INVENTION

Figure 5:
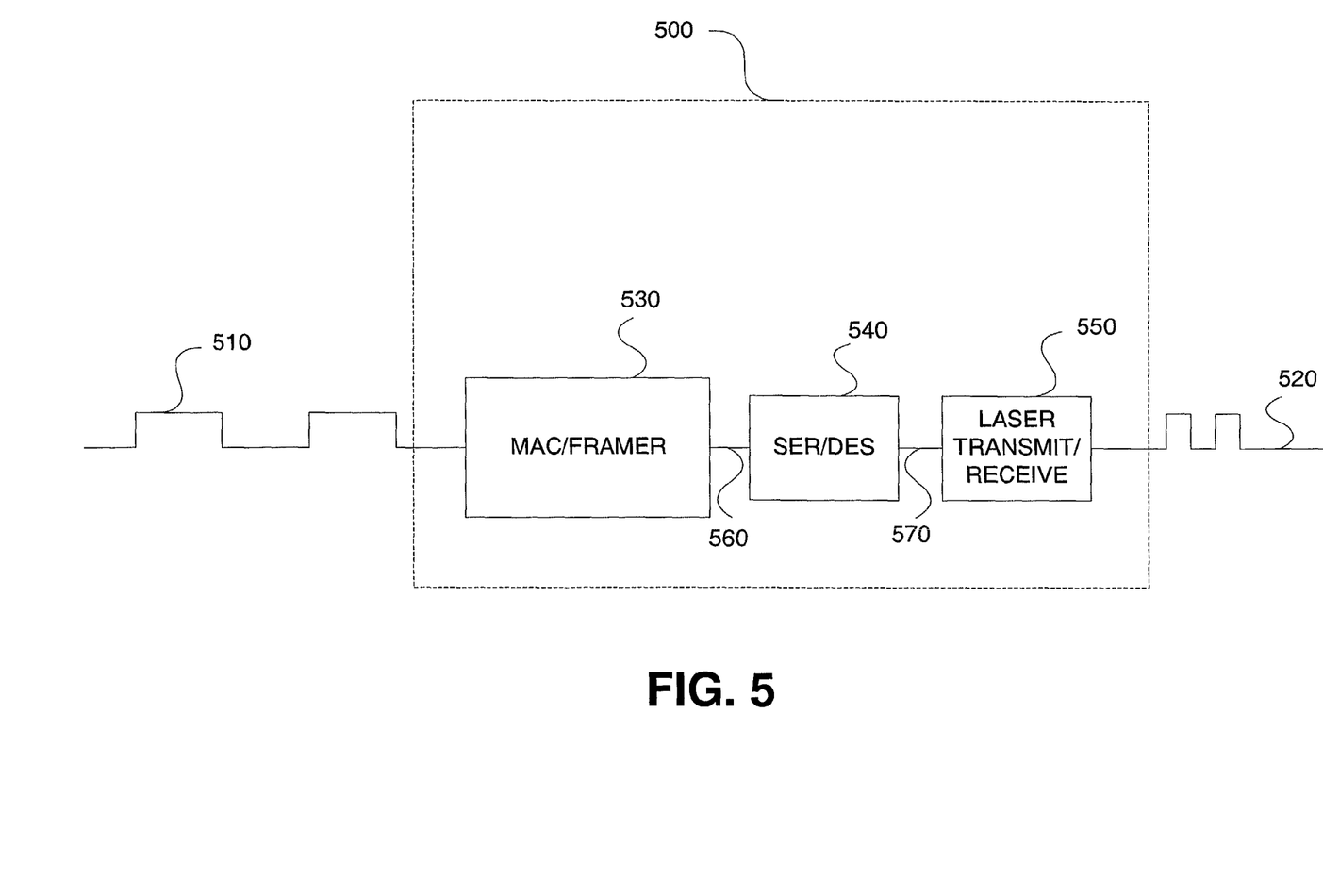
FIG. 5 is a diagram of an interface circuit board that allows devices to transmit information over optical network.

FIG. 5 shows an exemplary interface circuit 500 that enables devices to transmit information over optical network 110 by converting a 64-bit wide (i.e., 64-bit parallel stream) unencapsulated signal 510 at a first clock rate to an optical signal 520 at a second clock rate. Interface circuit 500 includes a MAC/framer circuit 530, a serialize /deserializer circuit 540, and a laser transmit/receive circuit 550.

During a transmit operation, MAC/framer circuit 530 receives 64-bit unencapsulated signal 510 from the device attempting to communicate data over optical network 110, encapsulates the data in accordance with Ethernet protocols, and prepares the data for transmission over optical network 110. An output signal 560 from MAC/framer circuit 530 is also 64 bits wide, but travels al an intermediate clock rate that is faster than 64-bit unencapsulated signal 510 and includes both the original data and the encapsulation information.

Serializer/deserializer circuit 540 transforms output signal 560 from a 64-bit parallel stream into a serial signal 570. Laser transmit/receive circuit 550 converts serial signal 570 into optical signal 520 and transports optical signal 520 over optical network 110. Both serial signal 570 and optical signal 520 communicate at the second clock rate, which, under the new Ethernet standard, can be up to 10-Gigabits per second.

The receive operation works the same way, but in reverse. Laser transmit/receive circuit 550 receives optical signal 520 and converts it into serial signal 570, an electrical signal of the same clock rate as optical signal 520. Serializer/deserializer circuit 540 transforms serial signal 570 into output signal 560, a slower 64-bit parallel encapsulated signal. MAC/framer 530 converts output signal 560 into 64-bit unencapsulated signal 510, which is then usable by the device receiving the information from optical network 110.

The process of encapsulation by MAC/framer 530 includes both adding extra fields, such as an opening flag, an address, a closing flag and a CRC field, and adding a 2-bit synch control word to every 64 bits of data. The added fields only occur once with each frame of data, so not compensating for the extra time required to transmit that information does not greatly effect the overall transmission speed. However, the extra 2-bit synch control occurs with every 64 bits of data, so the effect on overall speed is significant. MAC/ framer 230 compensates for the extra 2 bits by converting the data and synch control (66 bits total) into a 64-bit word traveling at the intermediate clock rate.

Figure 6:
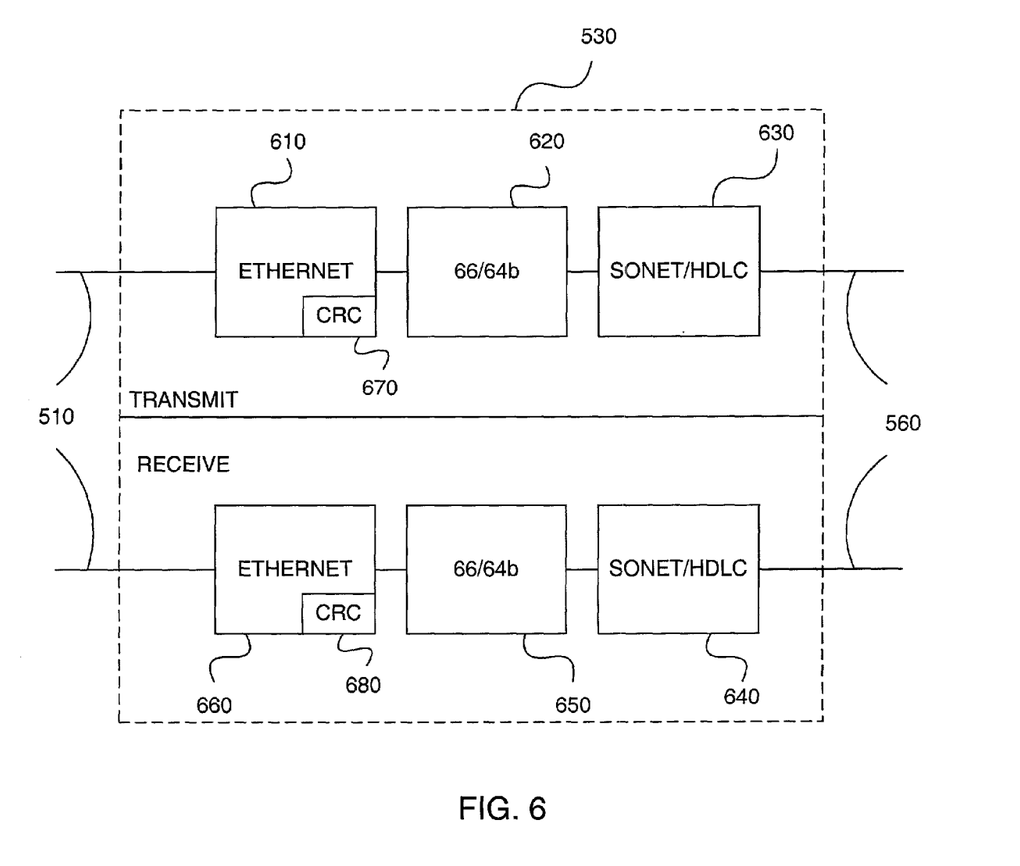
FIG. 6 is a diagram of a MAC/framer circuit with transmit and receive functions.

FIG. 6 shows a MAC/framer circuit 530 with transmit and receive functions. When transmitting, MAC/framer circuit 530 uses a transmit Ethernet circuit 610, a transmit 66/64b converter circuit 620, and a transmit SONET/HDLC circuit 630. When receiving, MAC/framer circuit 530 uses a receive SONET/HDLC circuit 640, a receive 66/64b converter circuit 650, and a receive Ethernet circuit 660.

Transmit Ethernet circuit 610 ensures all devices can understand one another by adhering to an Ethernet communication standard, detailing the physical and the lower software layers. Additionally, transmit Ethernet circuit 610 appends the 2-bit synch control to every 64 bits of data. Conversely, receive Ethernet circuit 660 strips all excess information and removes the 2-bit synch control from the data.

Transmit 66/64b converter circuit 620 converts a 66-bit data stream into a 64-bit data stream. The relationship between the clock rate of the signal entering transmit 66/64b converter circuit 620 and the clock rate of the signal leaving circuit 620 is the exiting signal is 33:32. No data is lost as long as 33 cycles of 64-bit data takes the same amount of time to propagate as 32 cycles of 66-bit data. Similarly, receive 66/64b converter circuit 650 slows down and expands a 64-bit data stream into a 66-bit data stream.

Transmit SONET/HDLC circuit 630 prepares bit streams for conversion to or from optical signals following the synchronous optical network (SONET) and high level data link control (HDLC) standards. Transmit SONET/HDLC circuit 630 completes the encapsulation process by ensuring the data stream adheres to the requirements of optical network 110. Receive SONET/HDLC circuit 640 merely reverses the process.

Additionally, FIG. 6 shows a transmit CRC circuit 670 in transmit Ethernet circuit 610 and a receive CRC circuit 680 in receive Ethernet circuit 660. Although performing the CRC calculation is just one function of Ethernet circuits 610 and 660, the CRC calculation is the primary method of error detection.

Figure 7A:
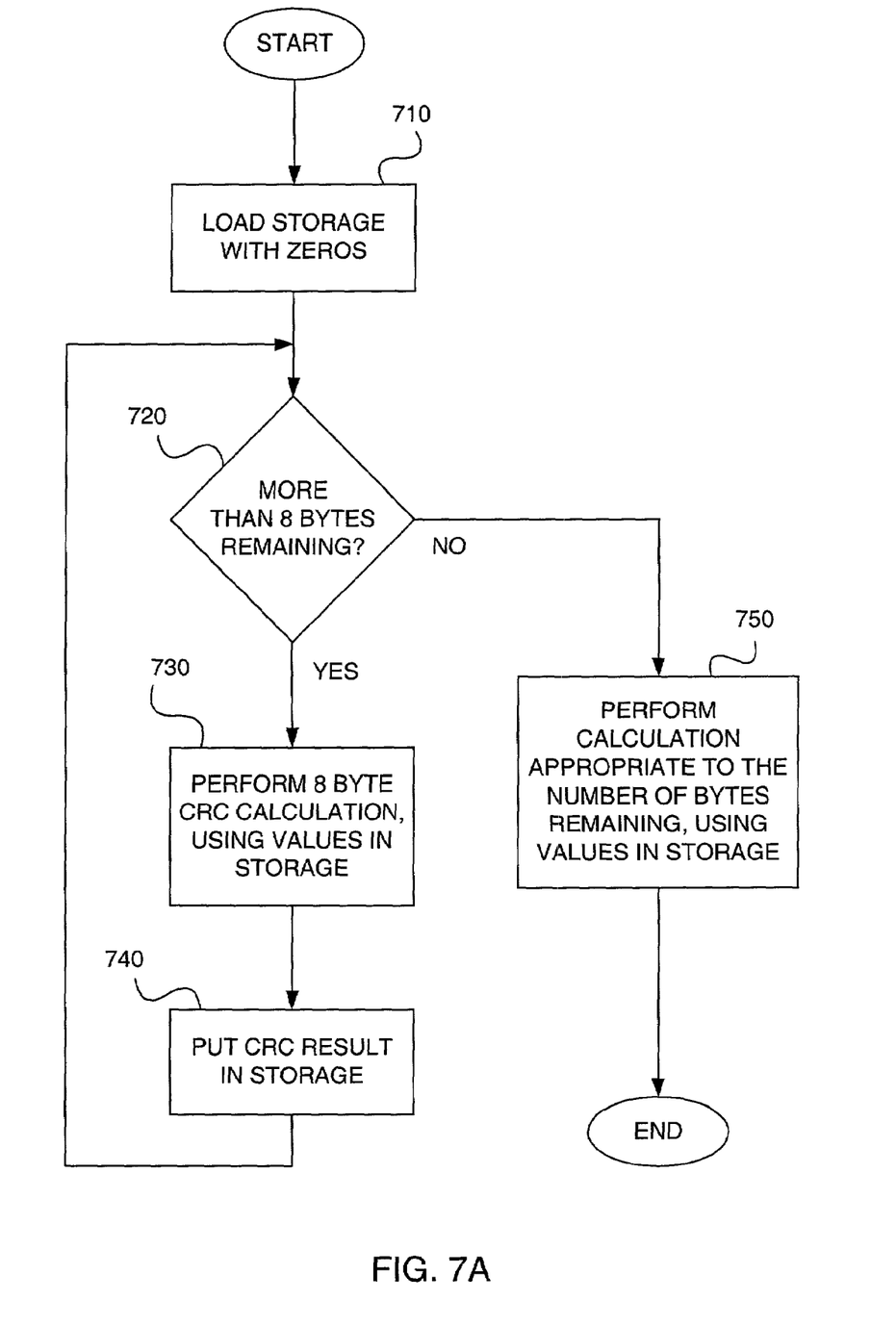
FIG. 7A is a flowchart of a method for using a multiple byte-wise CRC circuit that can perform CRC calculations up to eight bytes at a time.

FIG. 7A shows an exemplary method for using a multiple CRC circuit, which includes a plurality of CRC modules, that are configured for performing CRC calculations on up to eight bytes at a time. In one embodiment the plurality CR modules may include a total of eight CRC modules, each configured for performing a CRC calculation on a different number of bytes of data at a time (i.e., during a single cycle). For example, an eight-byte-wide CRC module may be included for performing a CRC calculation on an eight-byte-wide segment of data, a seven-byte-wide CRC module may be included for performing a CRC calculation on a seven-byte-wide segment of data, etc. First, in step 710 of the method, the storage is reset to zero in order to ensure that CRC values from a previous run do not influence the calculations.

Next, in step 720, a determination is made as to whether there are more than eight bytes remaining in the data stream. If there are more than eight bytes remaining, the process proceeds to step 730, where an eight-byte CRC calculation is performed on the data using e.g., an eight-byte-wide CRC module.

An eight-byte-wide CRC module can be constructed using the same general process as was described by Aram Perez for byte-wise CRC circuits. Namely, a bit-wise CRC circuit is first modeled, then the general values of each flip flop after sixty-four bits are calculated and, finally, a circuit module that implements the calculations is created. The resultant eight-byte-wide CRC module would be configured to perform an eight-byte CRC calculation on eight bytes of data and to produce results of such calculation, all in a single cycle. Alternatively, once a byte-wise CRC module is modeled for the appropriate generator polynomial, it could be repeatedly used to generate the same general values after 8 bytes (i.e., after eight cycles), as a bit-wise CRC circuit would generate after 64 bits (i.e., after 64 cycles). However, since a byte-wise CRC module is able to process only one byte at a time, it would take seven more cycles than the eight-byte-wide CRC module to produce the same result. Appendix I shows the results from such a calculation after using a CRC-32 generator polynomial.

In step 740, the results of the eight-byte CRC calculation are stored in memory. Although initially zero, the storage will likely change after every cycle. It should be noted that a very similar process could be used in a single byte-wise CRC circuit or module. Namely, a byte-wise CRC circuit would initialize the system in a step similar to step 710, and steps similar to steps 730 and 740 would be repeated until no more data was present. Of course, the byte-wise corollary to step 730 would perform a byte-wise CRC calculation, not an eight-byte CRC calculation, and thus, would need seven more cycles to produce the same results. Therefore, one having ordinary skill in the art should appreciate that techniques currently known in the art for byte-wise CRC calculations can be easily implemented in connection with steps 710, 730 and 740.

Steps 720 through 740 are repeated until there are eight or less bytes remaining in the data stream. Once it is determined that there are eight or less bytes remaining, the process progresses to step 750.

In step 750, one of eight CRC modules is used to calculate the CRC value on the remaining bytes of data. If there is only one byte remaining, a single-byte CRC module would need to be used. If there are two bytes remaining, a two-byte CRC module would be used, etc. Each CRC module could be constructed using the same general process of modeling known CRC Circuits, and then generating general values for the appropriate number of bytes to be processed per cycle. After an initial processing step is performed the inputs to the appropriate CRC module (i.e., the CRC module configured for processing the number of remaining bytes of data) would include the remaining bytes of data and the results from the prior CRC calculations, which were stored in step 730. Appendix II shows the general results of two bytes after modeling a CRC module using a CRC-32 generator polynomial. Appendix III shows the general results of three bytes after modeling a CRC module using a CRC-32 generator polynomial. Appendix IV shows the results of four bytes, Appendix V shows the results of five bytes, Appendix VI shows the results of six bytes and Appendix VII shows the results of seven bytes.

Figure 7B:
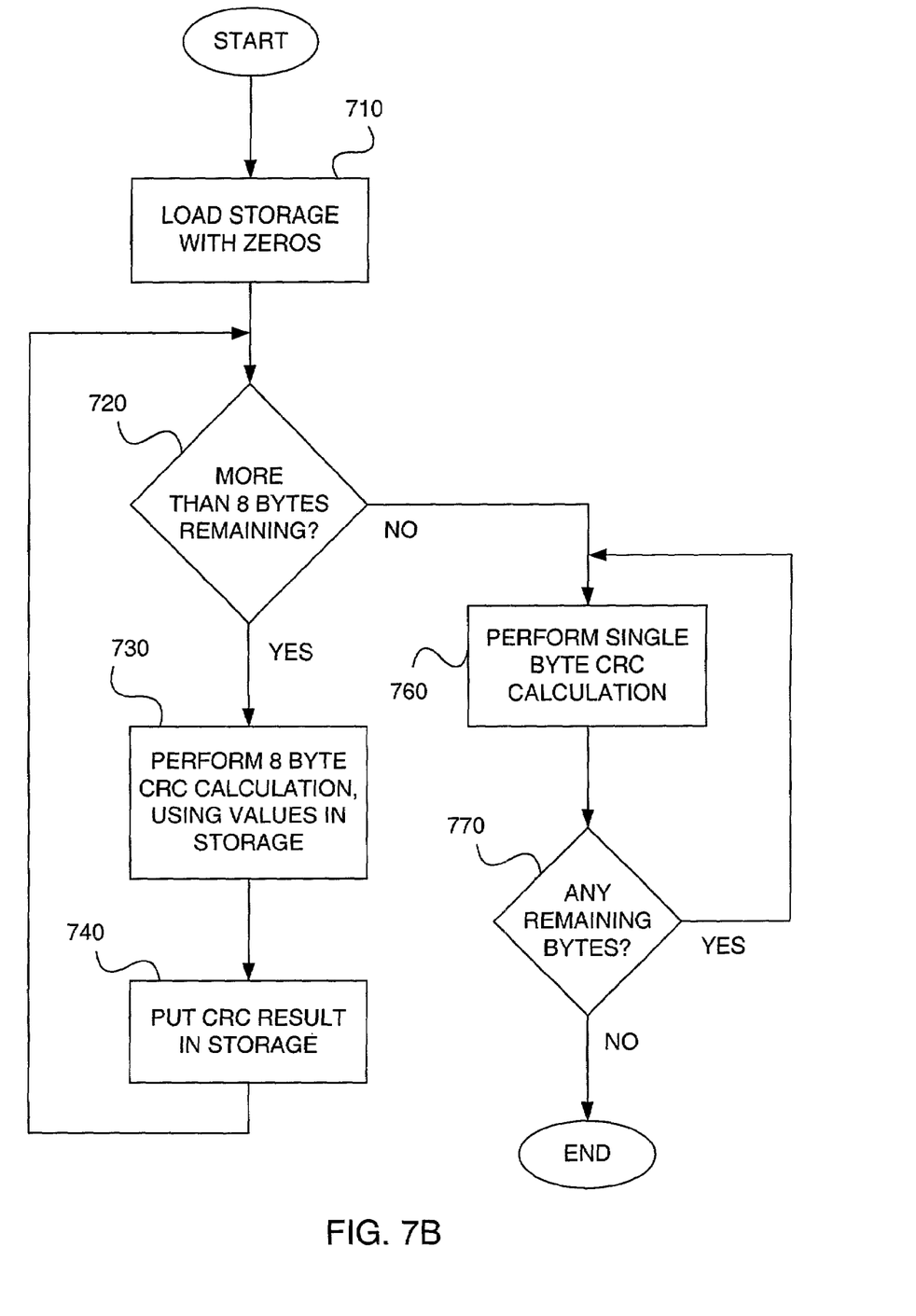
FIG. 7B is a flowchart of an alternate embodiment of a method for using a multiple byte-wise CRC circuit that can perform CRC calculations up to eight bytes at a time.

FIG. 7B shows an alternate method for performing a CRC calculation on data, according to another embodiment of the invention. In FIG. 7B, steps 710 through 740 are identical to steps 710 through 740 of FIG. 7A. However, instead of sending the remaining bytes of data to one of the eight different CRC modules, as was done in slop 750 of FIG. 7A, only one single-byte CRC module is used to process the remaining bytes of data (in step 760). After the single-byte CRC module performs a CRC calculation on the first byte of the remaining bytes of data, the process progresses to step 770, where a determination is made as to whether there are any more bytes to process. Therefore, step 760 may potentially be repeated up to eight times, which is seven cycles more than the process described in FIG. 7A. In certain applications, the extra time required to calculate the CRC of the data might be preferable to the cost of the extra circuitry. The maximum number of times step 760 repeats itself could be reduced if the same eight-byte CRC module, which was used in step 730, is used when there are exactly eight bytes of data remaining. Using the same eight-byte CRC circuit module would also be preferable in the method described in FIG. 7A in order to reduce the cost of the circuit.

A possible compromise between a large circuit and slow processing tunes might be a system that uses an eight-byte, a three-byte and a single-byte CRC module. Such a method would use significantly less chip area than the method described in FIG. 7A, and would take a maximum of two extra cycles to complete the CRC calculation.

Although the invention has been described in its currently contemplated best mode, it is clear that it is susceptible to numerous modifications modes of operation and embodiments, all within the ability and skill and skill of those familiar with the art and within the exercise of further inventive activity. Accordingly, that which is intended to be protected by patents is set forth in the claims and includes all variations and modifications that fall within the spirit and scope of the invention.

We claim:

1. A method of performing a cyclic redundancy check (CRC), calculation on a data stream composed of one or more segments of data, the method comprising:
    supplying the data stream, one data segment per cycle, to a multiple-byte cyclic redundancy check (CRC) circuits, comprising a plurality of CRC modules, wherein each of the CRC modules is configured to perform the CRC calculation on a different number of bytes of data during a single cycle;
    determining which one of the plurality of CRC modules should be used for processing a segment of data currently supplied to the multiple-byte CRC circuit;
    after said step of determining, processing the segment of data using only the CRC module determined appropriate for the current segment of data, wherein said step of processing comprises performing the CRC calculation on the current segment of data to produce CRC calculation results for the current cycle; and
    if more segments of data remain in the date stream, repeating the steps of determining and processing until there are no more segments of data to process.

2. The method of claim 1, wherein the method of performing a cyclic redundancy check calculation on a data stream is used in an interface circuit board.

3. The method or claim 1, wherein the multiple-byte CRC circuit uses a CRC-32 generator polynomial for performing the CRC calculation.

4. The method of claim 1, wherein at least one of the plurality of CRC modules is configured to perform the CRC calculation on a minimum number of bytes during a single cycle, and wherein the minimum number of bytes is substantially equal to one.

5. The method of claim 4, wherein at least one of the plurality of CRC modules is configured to perform the CRC calculation on a maximum number of bytes during a single cycle, and wherein the maximum number of bytes is selected from a range of integer values encompassing eight.

6. The method of claim 5, wherein the maximum number of bytes is eight bytes of data.

7. The method of claim 6, wherein the plurality of CRC modules includes;
    an eight byte-wide CRC module configured to perform a CRC calculation on an eight-byte-wide segment of data;
    a seven byte-wide CRC module configured to perform a CRC calculation on a seven-byte-wide segment of data;
    a six byte-wide CRC module configured to perform a CRC calculation on a six-byte-wide segment of data;
    a five byte-wide CRC module configured to perform a CRC calculation on a five-byte-wide segment of data;
    a four byte-wide CRC module configured to perform a CRC calculation on a four-byte-wide segment of data;
    a three byte-wide CRC module configured to perform a CRC calculation on a three-byte-wide segment of data;
    a two byte-wide CRC module configured to perform a CRC calculation on a two-byte-wide segment of data; and
    a single byte-wide CRC module configured to perform a CRC calculation on a one-byte-wide segment of data.

8. The method of claim 5, wherein each of the plurality of CRC modules is configured for using prior CRC calculation results from a previous cycle when performing a CRC calculation during a subsequent cycle.

9. The method of claim 5, wherein said step of determining comprises selecting one of the plurality of CRC modules based on a number of bytes in the current segment of data.

10. The method of claim 9, wherein if the current segment of data comprises a number of bytes, which is less than the maximum number of bytes:
    said step of determining comprises selecting, from the plurality of CRC modules, a CRC module configured for performing the CRC calculation on the number of bytes in the current segment of data; and
    said step of processing comprises using the selected CRC module to perform the CRC calculation on the current segment of data to produce final CRC calculation results.

11. The method of claim 9, wherein if the current segment of data comprises more than the maximum number of bytes:
    said step of determining comprises selecting the at least one CRC module configured for performing the CRC calculation on the maximum number of bytes;
    said step of processing comprises using the selected CRC module to perform the CRC calculation an the current segment of data to produce CRC calculation results for the current cycle; and
    wherein prior to said step of repeating, said method further comprises:
        storing the CRC calculation results for the current cycle; and
        ascertaining if a next segment of data will he supplied to the multiple-byte CRC circuit during a next cycle, and if so, whether the next segment of data comprises more than the maximum number of bytes.

12. The method of claim 11, wherein if the method ascertains that a next segment of data is not supplied to the multiple-byte CRC circuit, the stored CRC calculation results are considered final CRC calculation results and the method ends.

13. The method of claim 11, wherein if the method ascertains that a next segment of data is supplied to the multiple-byte CRC circuit and it comprises more than the maximum number of bytes;
    said step of determining comprises selecting the at least one CRC module configured for performing the CRC calculation on the maximum number of bytes;
    said step of processing comprises using the selected CRC module to perform the CRC calculation on the next segment of data and the stored CRC calculation results to produce CRC calculation results for the next cycle; and
    said step of storing comprises replacing the stored CRC calculation results with the CRC calculation results for the next cycle.

14. The method of claim 11, wherein if the method ascertains that a next segment of data is supplied to the multiple byte CRC circuit and it comprises a number of bytes, which is less than the maximum number of bytes:

said step of determining comprises selecting, from the plurality of CRC modules, a CRC module configured for performing the CRC calculation on the number of bytes in the next segment of data;

said step of processing comprises using the selected CRC module to perform the CRC calculation on the next segment of data and the stored CRC calculation results to produce CRC calculation results for the next cycle; and said step of storing comprises replacing the stored CRC calculation results with the CRC calculation results for the next cycle.

15. The method of claim 11, wherein if the method ascertains that a next segment of data is supplied to the multiple byte CRC circuit and it comprises a number of bytes, which is less than the maximum number of bytes:

said step of determining comprises selecting the at least one CRC module configured for performing the CRC calculation on the minimum number of bytes;

said step of processing comprises using the selected CRC module to perform the CRC calculation on a first byte of the next segment of data and the stored CRC calculation results to produce new CRC calculation results;

said step of storing comprises replacing the stored CRC calculation results with the new CRC calculation results; and repeating the steps of processing and storing until no bytes remain in the next segment of data.

* * * * *

UNITED STATES PATENT AND TRADEMARK OFFICE
CERTIFICATE OF CORRECTION

PATENT NO.         : 7,047,479 B1  
APPLICATION NO. : 10/068676  
DATED                 : May 16, 2006  
INVENTOR(S)        : Hagh-Panah et al.

Page 1 of 1

It is certified that error appears in the above-identified patent and that said Letters Patent is hereby corrected as shown below:

IN THE CLAIMS:

Col. 9, lines 23-24: After the phrase "redundancy check (CRC)," please delete "circuits" and substitute --circuit--.

Col. 9, line 37: After the phrase "data remain in the," please delete "date" and substitute --data--.

Signed and Sealed this

Seventeenth Day of April, 2007

JON W. DUDAS  
*Director of the United States Patent and Trademark Office*